(12) United States Patent
Kwong et al.

(10) Patent No.: US 6,975,517 B1
(45) Date of Patent: Dec. 13, 2005

(54) EMBEDDED PREEMPHASIS AND DEEMPHASIS CIRCUITS

(75) Inventors: Herman Kwong, Kanata (CA); Kah Ming Soh, Kanata (CA); Larry Marcanti, Allen, TX (US)

(73) Assignee: Nortel Networks Limited, Quebec (CA)

(*) Notice: Subject to any disclaimer, the term of this patent is extended or adjusted under 35 U.S.C. 154(b) by 0 days.

(21) Appl. No.: 10/448,227

(22) Filed: May 30, 2003

(51) Int. Cl.[7] ............................................. H05K 1/18
(52) U.S. Cl. ........................................ 361/763; 361/765
(58) Field of Search ............................... 361/760–766; 455/66.1, 63.1, 275; 386/54; 343/718–720; 327/22

(56) References Cited

U.S. PATENT DOCUMENTS

| | | | | |
|---|---|---|---|---|
| 4,053,834 A | * | 10/1977 | Lerner | 455/43 |
| 4,562,492 A | * | 12/1985 | Higurashi | 360/65 |
| 4,659,875 A | * | 4/1987 | Taurin et al. | 380/238 |
| 5,019,910 A | * | 5/1991 | Filmer | 725/68 |
| 5,298,684 A | * | 3/1994 | Leeb | 174/250 |
| 5,659,317 A | * | 8/1997 | Toyama et al. | 341/144 |
| 5,814,366 A | * | 9/1998 | Fukuta et al. | 361/313 |
| 6,621,012 B2 | * | 9/2003 | Crockett et al. | 174/261 |

* cited by examiner

*Primary Examiner*—Kamand Cuneo
*Assistant Examiner*—Tuan Dinh
(74) *Attorney, Agent, or Firm*—Hunton & Williams LLP

(57) ABSTRACT

Exemplary techniques for providing an embedded preemphasis circuit and/or a deemphasis circuit in a printed circuit board (PCB) or other circuit device are disclosed. In particular, a technique for preemphasizing and/or deemphasizing transmitted signals in a PCB-based circuit is provided. The technique may be realized as a preemphasis circuit for preemphasizing a signal being transmitted from a signal source to a signal destination. The preemphasis circuit comprises a printed circuit board (PCB), a resistor embedded in the PCB and having a first terminal electrically connected to the signal source and a second terminal electrically connected to the signal destination, and a capacitor embedded in the PCB and having a first terminal electrically connected to the signal source and a second terminal electrically connected to the signal destination.

12 Claims, 4 Drawing Sheets

EMBEDDED PREEMPHASIS AND DEEMPHASIS CIRCUITS

FIELD OF THE INVENTION

The present invention relates generally to the transmission of signals within and in between printed circuit boards (PCBs) and, more particularly, to a technique for using an embedded preemphasis circuit and/or deemphasis circuit to improve the signal-to-noise ratio of signals transmitted therein.

BACKGROUND OF THE INVENTION

Preemphasis circuits and deemphasis circuits may be beneficially used to suppress noise in transmitted signals and thereby increasing the signal-to-noise ratio (SNR) of the transmitted signals. In particular, in Frequency Modulation (FM) communication, a preemphasis circuit often is used at the signal source to provide a boost to the amplitude of the higher-frequency components of the signal. So while the noise level may remain the same, the relative signal to noise ratio of the high frequency components may be improved. At the signal destination, a deemphasis circuit may be used to correct the boost provided by the preemphasis circuit, thereby restoring the original balance between the high and low frequency portions of the signal.

In conventional circuit designs, preemphasis/deemphasis circuits typically are constructed using discrete components, such as surface mount (SMT) resistors and capacitors. The use of discrete components for preemphasis/deemphasis has a number of disadvantages. For one, the SMT resistors and capacitors occupy a considerable portion of the surface area of the PCB. As a result, a larger PCB often must be used to accommodate the SMT resistors and capacitors. Further, the presence of discrete resistors and capacitors on the surface of the PCB can introduce undesirable electromagnetic interference (EMI). Other disadvantages include an undesirable parasitic present at solder joints, an adverse yield impact caused by assembling more components and an added cost on inventory and part management.

In view of the foregoing, it would be desirable to provide a technique for preemphasizing and/or deemphasizing transmitted signals in a circuit that overcomes the above-described inadequacies and shortcomings. More particularly, it would be desirable to provide a technique for preemphasizing and/or deemphasizing a signal in PCBs in an efficient and cost effective manner.

SUMMARY OF THE INVENTION

According to the present invention, a technique for preemphasizing and/or deemphasizing transmitted signals in a PCB-based circuit is provided. In one particular exemplary embodiment, the technique may be realized as a preemphasis circuit for preemphasizing a signal being transmitted from a signal source to a signal destination. The preemphasis circuit comprises a printed circuit board (PCB), a resistor embedded in the PCB and having a first terminal electrically connected to the signal source and a second terminal electrically connected to the signal destination, and a capacitor embedded in the PCB and having a first terminal electrically connected to the signal source and a second terminal electrically connected to the signal destination.

In another embodiment, this technique may be realized as a deemphasis circuit for deemphasizing a signal transmitted from a signal source to a signal destination. The deemphasis circuit comprises a printed circuit board (PCB), a resistor embedded in the PCB and having a first terminal electrically connected to the signal source and a second terminal electrically connected to the signal destination, and a capacitor embedded in the PCB and having a first terminal electrically connected to the signal destination and a second terminal electrically connected to ground.

In yet another embodiment, this technique may be realized as an apparatus for transmitting a signal from a signal source to a signal destination comprising a printed circuit board (PCB), a preemphasis circuit and a deemphasis circuit. The preemphasis circuit includes a first resistor embedded in the PCB and having a first terminal and a second terminal, the first terminal being electrically connected to the signal source and a first capacitor embedded in the PCB and having a first terminal electrically connected to the signal source and a second terminal electrically connected to the second terminal of the first resistor. The deemphasis circuit includes a second resistor embedded in the PCB and having a first terminal electrically connected to the second terminal of the first resistor and a second terminal electrically connected to the signal destination and a second capacitor embedded in the PCB and having a first terminal electrically connected to the signal destination and a second terminal electrically connected to ground.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENT(S)

The following description is intended to convey a thorough understanding of the present invention by providing a number of specific embodiments and details involving preemphasizing and/or deemphasizing signals transmitted in printed circuit boards and other circuit devices. It is understood, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending upon specific design and other needs.

Figure 1:
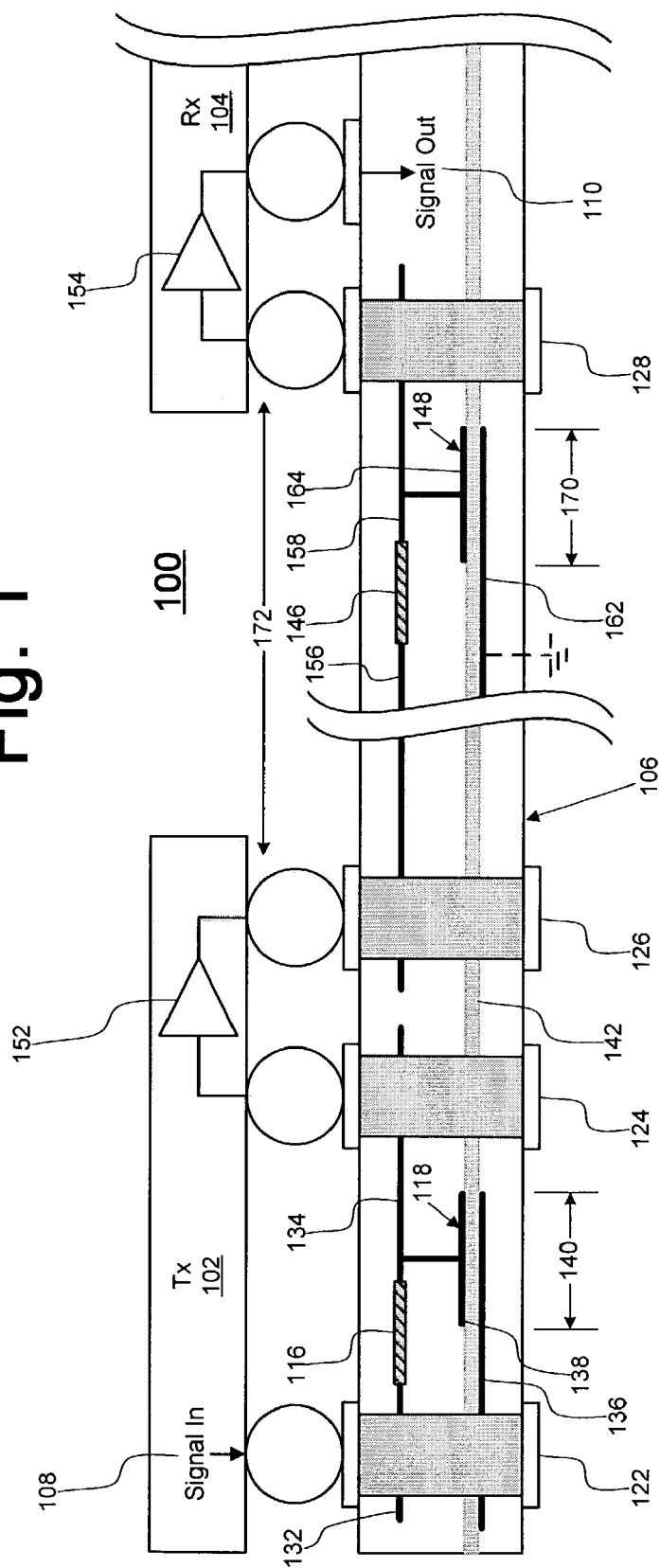
FIGS. 1 and 2 are side views illustrating cross-sections of exemplary printed circuit boards (PCB) comprising preemphasis and deemphasis circuits having embedded components.
Figure 2:
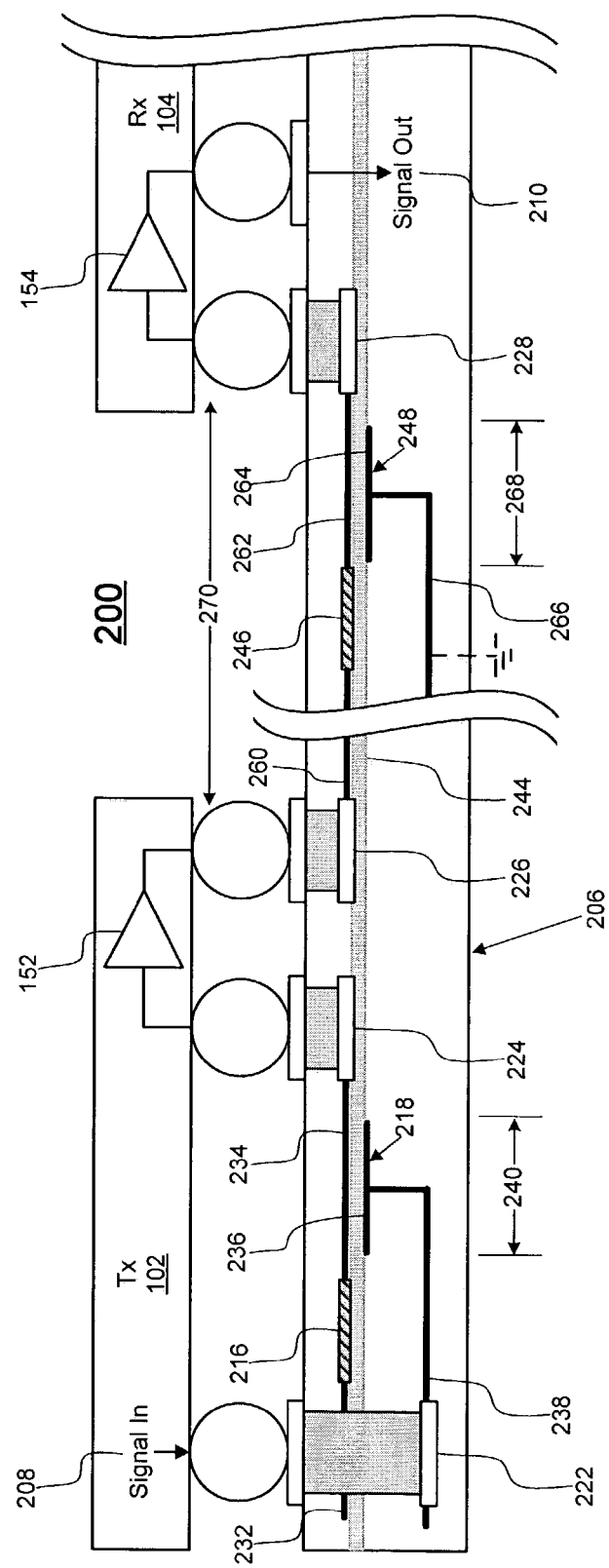

FIGS. 1–4 illustrate various exemplary techniques for providing an embedded preemphasis circuit and/or deemphasis circuit in a PCB or other circuit device to improve the fidelity of transmitted signals. In at least one embodiment, the preemphasis and deemphasis circuits are implemented using resistors and capacitors embedded at one or more layers of a PCB. FIG. 1 illustrates an exemplary embodiment wherein through holes are utilized to provide an electrical connection between the embedded resistors and capacitors and the surface layers of the PCB. FIG. 2 illustrates an exemplary embodiment wherein microvias are utilized to provide an electrical connection between the embedded resistors and capacitors and the surface layer of the PCB.

Although FIGS. 1 and 2 illustrate implementations of the present invention using particular types of inner-layer interconnection technique and inner-layer construction for ease of discussion, other inner-layer interconnection technique and inner-layer construction (e.g., a combination of through holes and microvias) may be utilized without departing from the spirit or the scope of the present invention.

Figure 3:
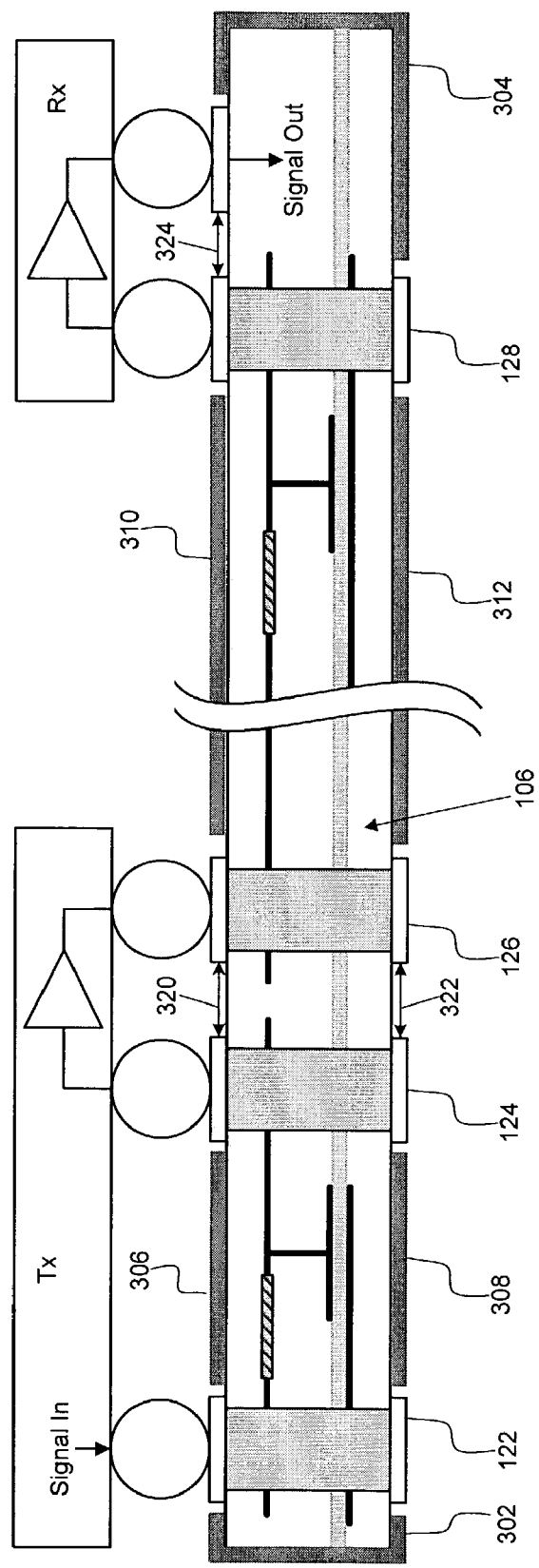
FIGS. 3 and 4 are side views illustrating a placement of electromagnetic interference (EMI) shields on the PCBs of FIGS. 1 and 2 in accordance with at least one embodiment of the present invention.
Figure 4:
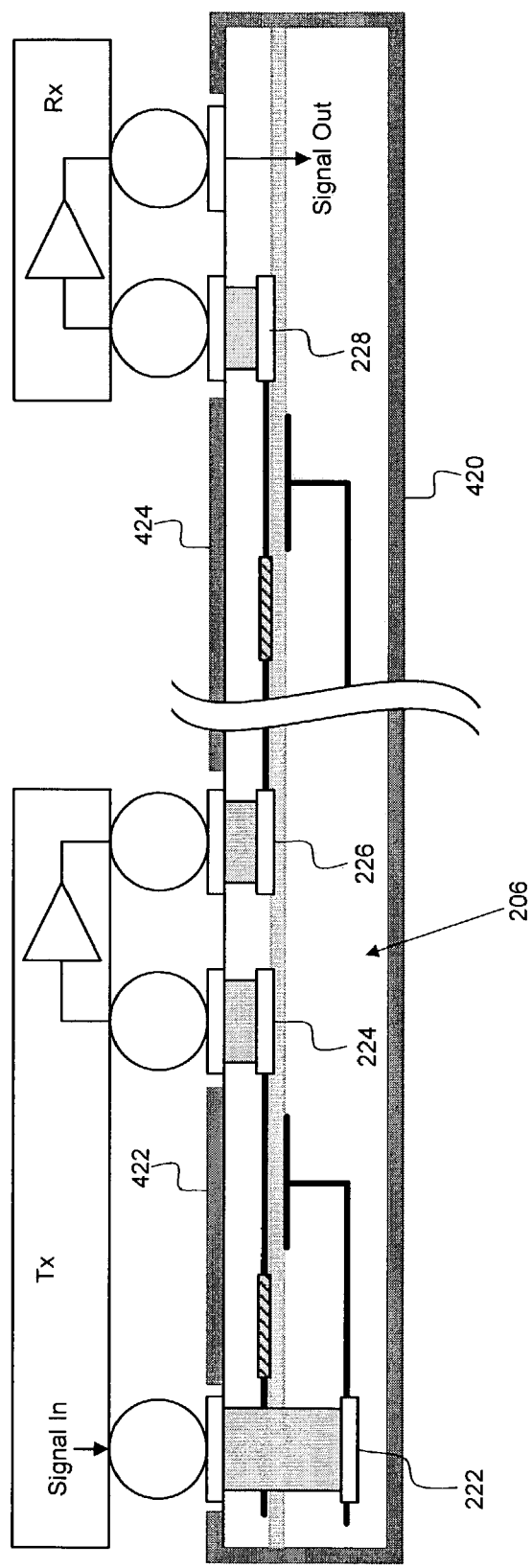

In accordance with at least one embodiment, shielding may be used to reduce or eliminate electromagnetic interference caused by circuit components (e.g., transmission line traces, embedded resistors/capacitors, vias, etc.) within the PCB. FIG. 3 illustrates an exemplary implementation of EMI shielding on the PCB illustrated in FIG. 1. FIG. 4 illustrates an exemplary implementation of EMI shielding on the PCB illustrated in FIG. 2. Those skilled in the art may adapt the EMI shielding implementations shown for PCBs having different types of interlayer connectors and/or a combination of connector types, using the guidelines provided herein.

Referring now to FIG. 1, a cross-section of an exemplary component 100 for minimizing signal loss using an embedded preemphasis circuit and deemphasis circuit is illustrated in accordance with at least one embodiment of the present invention. In the illustrated example, the component 100 includes a transmission integrated circuit (IC) 102 and receiver circuit 104 connected to a PCB 106.

Although the signal source and signal destination are illustrated as ICs for ease of illustration, other implementations of the signal source and signal destination (e.g., as SMT discrete components) may be utilized without departing from the spirit or the scope of the present invention. Likewise, although the signal source and signal destination are illustrated in FIG. 1 as being located on the same PCB 106, using the guidelines provided herein, those skilled in the art will recognize that the signal transmission circuit and signal reception circuit may be located on different PCBs through the use of one or more PCB interconnect techniques, such as mechanical connectors, conductive adhesives, cables soldered onto the boards, etc. Further, the PCB 106 may comprise a single layer PCB or multilayer PCB as appropriate.

The transmission IC 102 may include any of a variety of circuits adapted to output one or more signals. To facilitate in the transmission of an output signal, in at least one embodiment, the transmission IC 102 includes an amplifier 152 (e.g., a power amplifier) adapted to boost the signal prior to transmission. The receiver IC 104 may include any of a variety of circuits adapted to receive and amplify one or more transmitted signals prior to sending it to the next stage for further processing. As with the transmission IC 102, the receiver IC 104 typically includes an amplifier 154 to boost the received signal prior to processing.

The one or more transmitted signals may comprise any of a variety of electrical signals, such as audio signals, data signals, video signals, and the like. The present invention may be applied to signals in a wide range of frequencies, from Hertz (Hz) to Gigahertz (GHz) range. In at least one embodiment, the present invention preferably is adapted for use in audio applications, such as, for example, frequency modulation (FM) applications and amplitude modulation (AM) applications. More specifically, exemplary audio applications where at least one embodiment of the present invention proves advantageous include half-duplex (HDX), full duplex (FDX), mini-HDX, and HDX-C applications. The frequency range of such audio applications may include a range of about 10 Hz to about 20 kHz, more preferably a range of about 100 Hz to about 10 kHz, and more preferably a range of about 300 Hz to about 4 kHz.

In at least one embodiment, a preemphasis circuit comprising an embedded resistor 116 and an embedded capacitor 118 is utilized to emphasize the high frequency components of the signals to be transmitted. Additionally, in one embodiment, the amplifier 152 may be utilized in the preemphasis circuit to boost the amplitude of the resulting preemphasized signal. In the illustrated embodiment of FIG. 1, the embedded resistor 116 includes a planar resistor embedded along a PCB layer between through hole 122 and through hole 124 and is connected to the through hole 122 via a transmission line portion 132 and to the through hole 124 via a transmission line portion 134. The layer at which the resistor 116 is embedded can include a surface layer or inner layer of the PCB 106.

In at least one embodiment, the embedded capacitor 118 comprises a planar capacitor embedded at the same or different PCB layer as the embedded resistor 116. The planar capacitor may include, for example, a transmission line portion 136 on one side of dielectric material (e.g., dielectric layer 142) and a transmission line portion 138 on the opposing side of the dielectric material, where the transmission line portion 136 is electrically connected to the through hole 122 and the transmission line portion 138 is electrically connected to the transmission line portion 134 or the through hole 124. The transmission line portions 136, 138 preferably are coextensive and substantially parallel over region 140 of the dielectric material.

In the illustrated embodiment, the transmission line portions 136, 138 are embedded on different PCB layers with the dielectric layer 142 interposed between the line portions 136, 138. In another embodiment, the transmission line portions 136, 138 may be embedded on the same PCB layer with dielectric material interposed between the portions 136, 138 at the same layer.

The through hole 124, in one embodiment, may be electronically connected to the input of the amplifier 152 and the through hole 126 may be connected to the output of the amplifier 152.

Although FIG. 1 illustrates an exemplary implementation whereby the preemphasis circuit and deemphasis circuit each comprise a single embedded resistor and capacitor, any number of embedded resistors and/or capacitors may be implemented to achieve the desired resistance and capacitance. For example, any number of embedded resistors may be connected in series or parallel (or both) to achieve the desired resistance. Likewise, any number of embedded capacitors may be connected in series or parallel (or both) to achieve the desired capacitance. Accordingly, any reference to a resistor applies equally to a combination of resistors and any reference to a capacitor applies equally to a combination of capacitors, unless otherwise noted.

Those skilled in the art will recognize that the illustrated configuration of the embedded resistor 116, embedded capacitor 118 (and the amplifier 152) results in a preemphasis circuit between the through hole 122 and the through hole 126. Accordingly, an incoming signal 108 provided to the throughput hole 122 may have its higher-frequency components emphasized by passing the signal 108 through the parallel combination of the embedded resistor 116/embedded capacitor 118 (acting in a manner similar to a high pass filter) and then boosted by the amplifier 152.

In addition to, or instead of, the preemphasis circuit, the component 100 may further include a deemphasis circuit utilized to deemphasize the higher-frequency components of a signal transmitted from the transmission IC 102. In at least one embodiment, the deemphasis circuit comprises an embedded resistor 146 and an embedded capacitor 148 connected as a low-pass filter. The deemphasis circuit also may include the amplifier 154 having an input connected to the downstream terminals of the resistor 146 and capacitor 148.

In at least one embodiment, the embedded resistor 146 comprises a planar resistor embedded between through hole 126 and through hole 128 at one or more PCB layers. The one terminal of the embedded resistor 146 may be connected to the through hole 126 via a transmission line portion 156 and another terminal connected to the through hole 128 via a transmission line portion 158.

The embedded capacitor 148, in at least one embodiment, comprises a planar capacitor embedded at the same or different PCB layer(s) as the embedded resistor 146. One terminal of the planar capacitor may include, for example, a transmission line portion 162 on one side of a dielectric layer 142 that is electrically connected to ground. The other terminal may include, for example, a transmission line portion 164 on the opposing side of the dielectric layer 142 that is electrically connected to the through hole 128. The transmission line portions 162, 164 preferably are coextensive and substantially parallel over region 170 of the dielectric layer 142 or other dielectric layer.

The through hole 128, in one embodiment, may be electronically connected to the input of the amplifier 154. The output signal 110 of the amplifier 154 then may be processed internally by the receiver circuit 104 and/or transmitted to another circuit component via one or more conductive traces of the PCB 106.

The described configuration of the embedded resistor 146, embedded capacitor 148 and amplifier 154 generally results in a deemphasis circuit between the through hole 126 and the output of the amplifier 154. Accordingly, a signal provided to the transmission line portion 156 may have its higher-frequency components deemphasized by passing the signal through the embedded resistor 146/embedded capacitor 148 (acting as a low pass filter), thereby counteracting the preemphasis boost provided by the preemphasis circuit. The deemphasis circuit preferably reduces the amplitude of the high-frequency components of one or more transmitted signals by an amount substantially identical to the increase the high-frequency content provided by the preemphasis circuit. The resulting signal then may be amplified by the amplifier 154 and processed by the receiver IC 104 and/or other circuits as appropriate.

The embedded resistors 116, 146 may be embedded in or on the PCB 106 using any of a variety of techniques, such as photolithographic techniques, screen printing, electroplating, and/or dispensing of passive materials at the appropriate layer of the PCB 106. The embedded resistors 116, 146 may comprise any of a variety of electrically resistive materials, or a combination thereof, such as carbon, nickel, ceramic metal composites, polymer thick film, macdermic nickel phosphate and the like. The resistive material comprising the embedded resistors 116, 146 may be formed in any of a variety of patterns, such as in a serpentine, squared, circular, or trapezoidal shape, and may extend between multiple PCB layers.

As noted above, the embedded capacitors 118, 148 preferably are generated at the designated PCB layer(s) of PCB 106 by overlapping conductive material (e.g., to form a parallel plate capacitor structure in a variety of patterns such as square, rectangular, or circular, as part of two transmission lines) on opposing sides of a substrate material having a high dielectric value (e.g., dielectric layer 162), thereby creating a capacitive effect between the overlapping portions of the conductive material.

In many instances, it may be advantageous to tailor the preemphasis circuit and/or deemphasis circuit based on the frequency range of the transmitted signal, the distance 172 the signal is to be transmitted, and the like. The preemphasis and deemphasis circuits may be adapted by adjusting the resistance of their respective embedded resistors, adjusting the capacitance of their respective embedded capacitors, and/or by adjusting the characteristics of the respective amplifiers, to achieve the desired degree of emphasis in the transmitted signal and the desired degree of deemphasis in the received signal. To illustrate, a combination of resistor and capacitor values may be used to provide a time constant of 75 microseconds used in standard FM broadcasting in the United States. Such a combination may include, for example, 50 ohms with 1.5 microfarads, 75 ohms with 1 microfarads, 100 ohms with 750 nanofarads, 1000 ohms with 75 nanofarads, among others.

It will be appreciated that current techniques for deposing resistive material often result in planar resistors having undesirable tolerances. To illustrate, embedded resistors made using polymer thick film technology or metal thin film technology often have tolerances greater than ±10%. Accordingly, in at least one embodiment, one or more trimming techniques may be used to trim the embedded resistive material to fall within the desired tolerance. For example, laser trimming often may be used to achieve resistance tolerances of ±1% of the desired resistance.

As described above, the use of preemphasis and deemphasis circuits when transmitting one or a plurality of signals often provides a number of benefits, such as decreasing the SNR of the transmitted signals, enabling cost reduction through elimination of discrete components and higher assembly yield. The use of embedded resistors and capacitors in accordance with at least one embodiment of the present invention provides additional advantages over implementations of preemphasis/deemphasis circuits using SMT resistors and capacitors in that use of surface area of the PCB 106 is limited and/or EMI is reduced.

Referring now to FIG. 2, an exemplary component 200 having a preemphasis circuit and a deemphasis circuit is illustrated in accordance with at least one embodiment of the present invention. The component 200 may include a signal source (represented by the transmission IC 102) connected to a signal destination (represented by the receiver IC 104) via one or more PCBs 206. The preemphasis circuit may be implemented as, for example, an embedded resistor 216 and embedded capacitor 218 located at one or more layers of the PCB 206. Likewise, the deemphasis circuit may be implemented as an embedded resistor 246 and embedded capacitor 248 located at one or more layers of the PCB 206. In the illustrated example, the resistors 216, 218 and part of capacitors 218, 248 are shown located at a same layer.

The embedded resistors 216, 246 may be created using the same or similar techniques discussed above with reference to embedded resistors 116, 146 of FIG. 1. Likewise, the capacitors 218, 248 may be created in the same or similar manner as discussed above with reference to the capacitors 118, 148 of FIG. 1.

In contrast with PCB 106 of FIG. 1, the exemplary PCB 206 implements microvias 222–228 rather than through holes to provide an electrical connection between the embedded components of the preemphasis/deemphasis circuits and the surface layer of the PCB 206. It will be appreciated that microvias often provide a number of advantages over other types of vias in PCBs, such as reduced surface area requirements and reduced signal artifacts (e.g., impedance). While the use of two types of interlayer connectors, through holes and microvias, are illustrated with reference to FIGS. 1–4, those skilled in the art may implement other types of interlayer connectors using the guidelines provided herein. Further, any combination of connector types may be used without departing from the spirit or the scope of the present invention.

In the illustrated example, the embedded resistor 216 is electrically connected to the microvia 222 by a transmission line portion 232 and is electrically connected to the microvia 224 by a transmission line portion 234. The embedded capacitor 218 may comprise, for example, a transmission line portion 236 separated from the transmission line portion 234 by a dielectric layer 244. The transmission line portion 236 preferably overlaps and is substantially parallel to the transmission line 234 over region 240. The transmission line portion 236 may be electrically connected to the microvia 222 using transmission line 238.

The embedded resistor 246 of the deemphasis circuit may be electrically connected to the microvias 226 and 228 using, for example, transmission line portions 260 and 262, respectively. The embedded capacitor 248 may be created by placing a transmission line portion 264 at a layer opposite of the transmission line portion 262 such that the portions 262, 264 overlap over region 268 of a dielectric material (e.g., dielectric layer 244). The transmission line portion 264 may be connected to ground using, for example, transmission line portion 266.

The preemphasis/deemphasis circuits of component 200 typically operate in a manner similar to the exemplary operation of the component 100 described above. The incoming signal 208 may be provided to the microvia 222 from a pin of the transmission IC 102 or from another circuit attached to the microvia 222. From the microvia 222, the signal 208 may be transmitted to the microvia 224 through the embedded resistor 216 and the embedded capacitor 218. The high frequency components of signal 208 are preemphasized by the parallel combination of the resistor 216 and capacitor 218 prior to reaching the input of the amplifier 152 via the microvia 224. The amount by which the high frequency components of the transmitted signals and the frequencies significantly affected are based at least in part by the resistance provided by the resistor 216 and/or the capacitance provided by the capacitor 218. Accordingly, the resistive value of the resistor 216 and capacitive value of the capacitor 218 may be selected as to achieve the desired effects on the incoming signal 208.

The high frequency components of signal 208 then may be boosted by the amplifier 152 and provided to the deemphasis circuit via the microvia 226 and transmission line portion 260. The boosted signal is provided to the microvia 228 via the embedded resistor 246 and the embedded capacitor 248, resulting in a signal having the higher-frequency components deemphasized by the resistor/capacitor combination.

As with the resistor 216 and capacitor 218, the resistive value of the resistor 246 and/or the capacitive value of the capacitor 248 may be selected to achieve the desired deemphasis effect. In at least one embodiment, the deemphasis circuit is configured to deemphasize the transmitted signal to substantially offset the preemphasis provided by the preemphasis circuit. The signal then may be provided to the input of the amplifier 154 via the microvia 228. The resulting amplified signal (signal 210) then may be processed further by the receiver IC 104 and/or provided to other circuits via the PCB 206.

As described above with reference to component 100 of FIG. 1, the use of the preemphasis circuit and deemphasis circuit in the component 200 provides a number of advantages, including an improved SNR of the transmitted signal, cost reduction from elimination of discrete components and higher assembly yield from dealing with fewer components.

While the preemphasis and deemphasis circuits preferably are utilized together, in some instances, it may be advantageous to utilize only the preemphasis circuit or only the deemphasis circuit. It may prove advantageous to use a preemphasis circuit having embedded resistors and capacitors, as described herein, with a deemphasis circuit located on the surface of the PCB 206. Similarly, it may prove beneficial to use a surface-mounted preemphasis circuit with an embedded deemphasis circuit.

In some instances, excessive electromagnetic interference (EMI) from surrounding components or traces may interfere with the operation of circuits attached to the PCB. In other instances, regulatory rules may forbid radiation from the circuit pack to the surrounding area. Accordingly, in at least one embodiment, EMI shielding may be placed on surface areas of the PCB to reduce or eliminate the EMI effects.

Referring now to FIG. 3, an exemplary implementation of EMI shielding on the PCB 106 of the component 100 of FIG. 1 is illustrated in accordance with at least one embodiment of the present invention. FIG. 3 illustrates a cross-section of the PCB 106 whereby EMI shielding is placed on various surface areas of the PCB 106, resulting in a type of "Faraday cage" whereby some or all of the EMI emitted from within the PCB 106 is contained by the EMI shielding.

The EMI shielding may be placed at any of a variety of positions on the surface of the PCB 106. In the illustrated example, the EMI shield for the PCB 106 comprises EMI shield portions 302–312. Note, however, that while the EMI shield is illustrated as portions 302–312 in the cross-section view of the PCB 106, in at least one embodiment, portions 302–306 are interconnected such that the EMI shield comprises a single, electrically continuous EMI shield situated around certain surface features of the PCB 106, such as the surface portions of the through holes 122–128. In some instances, it may be overly difficult or expensive to cover portions of the PCB 106 situated between certain surface features, such as regions 320–324. Accordingly, EMI shielding material may be omitted from these regions.

Referring now to FIG. 4, an EMI shield for the PCB 206 of FIG. 2 is illustrated in accordance with one embodiment of the present invention. In the illustrated example, the EMI shield comprises shield portions 420–424 situated on the surface of the PCB 206. As with the EMI shield of FIG. 3, the shield portions 420–424 preferably are interconnected to create a single, electronically continuous EMI shield around the PCB 206. Note that the use of microvias 222–226 in the PCB 206 may allow a more "complete" EMI shield than the EMI shield in the PCB 106 of FIG. 2 that uses through holes.

The EMI shields of FIG. 3 and FIG. 4 may comprise any of a variety of electroless and/or electroplated metals, conductive materials, such as metal-filled polymer, metal foil wrap, conductive tape, and the like. Any of a variety of techniques may be used to apply the EMI shield to the surface of the PCB, such as photolithography, screen printing, electroplating, direct dispensing of the EMI shield material, and the like.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A preemphasis circuit for preemphasizing a signal being transmitted from a signal source to a signal destination, the preemphasis circuit comprising:
   a printed circuit board (PCB);
   a resistor embedded in the PCB and having a first terminal electrically connected to the signal source and a second terminal electrically connected to the signal destination; and
   a capacitor embedded in the PCB and having a first terminal electrically connected to the signal source and a second terminal electrically connected to the signal destination, the embedded capacitor comprising substantially parallel and coextensive portions of the first terminal and the second terminal formed on opposite sides of a corresponding portion of a continuous dielectric layer of the PCB;
   wherein the preemphasis circuit forms a high pass filter for preemphasizing the signal being transmitted from the signal source to the signal destination.

2. The preemphasis circuit as in claim 1, further comprising an amplifier electrically connected between the resistor and the signal destination, the amplifier having an input electrically connected to the second terminal of the resistor and an output electrically connected to the signal destination.

3. The preemphasis circuit as in claim 1, wherein the embedded capacitor is embedded at a single PCB layer.

4. The preemphasis circuit as in claim 1, wherein the embedded resistor is embedded at a surface layer of the PCB.

5. The preemphasis circuit as in claim 1, further comprising an electromagnetic interference (EMI) shield formed on at least a portion of at least one surface of the PCB.

6. The preemphasis circuit as in claim 1, wherein the signal has a frequency range between 300 and 4000 Hz.

7. A deemphasis circuit for deemphasizing a signal being transmitted from a signal source to a signal destination, the deemphasis circuit comprising:
   a printed circuit board (PCB);
   a resistor embedded in the PCB and having a first terminal electrically connected to the signal source and a second terminal electrically connected to the signal destination; and
   a capacitor embedded in the PCB and having a first terminal electrically connected to the signal destination and a second terminal electrically connected to ground, the embedded capacitor comprising substantially parallel and coextensive portions of the first terminal and the second terminal formed on opposite sides of a corresponding portion of a continuous dielectric layer of the PCB;
   wherein the deemphasis circuit forms a low pass filter for deemphasizing the signal being transmitted from the signal source to the signal destination.

8. The deemphasis circuit as in claim 7, further comprising an amplifier electrically connected between the resistor and the signal destination, the amplifier having an input electrically connected to the second terminal of the first resistor and an output electrically connected to the signal destination.

9. The deemphasis circuit as in claim 7, wherein the capacitor is embedded at a single PCB layer.

10. The deemphasis circuit as in claim 7, wherein the first resistor is embedded at a surface layer of the PCB.

11. The deemphasis circuit as in claim 7, further comprising an electromagnetic interference (EMI) shield formed on at least a portion of at least one surface of the PCB.

12. The deemphasis circuit as in claim 7, wherein the signal has a frequency range between 300 and 4000 Hz.

* * * * *